United States Patent
Feiring et al.

(10) Patent No.: US 7,264,914 B2
(45) Date of Patent: Sep. 4, 2007

(54) FLUORINATED POLYMERS HAVING POLYCYCLIC GROUPS WITH FUSED 4-MEMBERED CARBOCYCLIC RINGS, USEFUL AS PHOTORESISTS, AND PROCESSES FOR MICROLITHOGRAPHY

(75) Inventors: Andrew E. Feiring, Wilmington, DE (US); Frank L Schadt, III, Wilmington, DE (US); Viacheslav Alexandrovich Petrov, Hockessin, DE (US); Bruce Edmund Smart, Wilmington, DE (US); William Brown Farnham, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 4 days.

(21) Appl. No.: 10/523,491

(22) PCT Filed: Aug. 8, 2003

(86) PCT No.: PCT/US03/25022

§ 371 (c)(1),
(2), (4) Date: Feb. 3, 2005

(87) PCT Pub. No.: WO2004/014964

PCT Pub. Date: Feb. 19, 2004

(65) Prior Publication Data

US 2005/0277052 A1 Dec. 15, 2005

(51) Int. Cl.
*G03F 7/004* (2006.01)
*C08F 232/04* (2006.01)

(52) U.S. Cl. .............. 430/270.1; 430/326; 430/905; 430/907; 430/910; 526/281

(58) Field of Classification Search ............ 430/270.1, 430/905, 906, 910, 907, 326; 526/281
See application file for complete search history.

(56) References Cited

U.S. PATENT DOCUMENTS

| 2,928,865 A | 3/1960 | Brasen et al. |
| 5,229,473 A | 7/1993 | Kobo et al. |
| 6,593,058 B1 * | 7/2003 | Feiring et al. ........... 430/270.1 |
| 6,723,486 B2 * | 4/2004 | Wallow et al. .......... 430/270.1 |
| 2002/0119398 A1 | 8/2002 | Desimone et al. |

OTHER PUBLICATIONS

Reichmanis et al., "The Effect of Substituents on the Photosensitivity of 2-Nitrobenzyl Ester Deep UV Resists", J. Electrochem. Soc., vol. 130, 1433-1437, 1983.

* cited by examiner

*Primary Examiner*—John S. Chu

(57) ABSTRACT

This invention provides novel fluorine containing polymers which comprise at least one fluorinated olefin, at least one polycyclic ethylenically unsaturated monomer with a fused 4-membered carbocyclic ring and, optionally, other components. The polymers are useful for photoimaging compositions and, in particular, photoresist compositions (positive-working and/or negative-working) for imaging in the production of semiconductor devices. The polymers are especially useful in photoresist compositions having high UV transparency (particularly at short wavelengths, e.g., 157 nm) which are useful as base resins in resists and potentially in many other applications.

45 Claims, No Drawings

FLUORINATED POLYMERS HAVING POLYCYCLIC GROUPS WITH FUSED 4-MEMBERED CARBOCYCLIC RINGS, USEFUL AS PHOTORESISTS, AND PROCESSES FOR MICROLITHOGRAPHY

BACKGROUND OF THE INVENTION

The present invention relates to fluorine containing polymers which comprise at least one fluorinated olefin, at least one polycyclic ethylenically unsaturated monomer with a fused 4-membered carbocyclic ring and, optionally, other components. The polymers are useful for photoimaging compositions and, in particular, photoresist compositions (positive-working and/or negative-working) for imaging in the production of semiconductor devices. The polymers are especially useful in photoresist compositions having high UV transparency (particularly at short wavelengths, e.g., 157 nm) which are useful as base resins in resists and potentially in many other applications.

There is a critical need for resist compositions for use at 193 nm or lower wavelengths, and particularly at 157 nm, that have not only high transparency at short wavelengths but also other key properties, including good plasma etch resistance and adhesive properties.

SUMMARY OF THE INVENTION

In a first aspect, the invention provides a fluorine-containing polymer comprising:

(a) at least one repeat unit derived from an ethylenically unsaturated compound having at least one fluorine atom covalently attached to an ethylenically unsaturated carbon atom, and (b) at least one repeat unit derived from an ethylenically unsaturated compound having the structure:

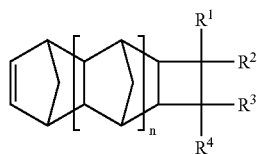

wherein n is 0, 1, or 2;

$R^1$, $R^2$, $R^3$ and $R^4$ are independently H, $OR^5$, halogen, alkyl or alkoxy of 1 to 10 carbon atoms, optionally substituted by halogen or ether oxygens, Y, $C(R_f)(R_f')OR^5$, $R^6Y$ or $OR^6Y$;

Y is COZ or $SO_2Z$;

$R^5$ is hydrogen or an acid-labile protecting group;

$R_f$ and $R_f'$ are the same or different fluoroalkyl groups of 1 to 10 carbon atoms or taken together are $(CF_2)_m$ where m is 2 to 10;

$R^6$ is an alkylene group of 1 to 20 carbon atoms, optionally substituted by halogen or ether oxygen;

Z is OH, halogen, or $OR^7$; and $R^7$ is an alkyl group of 1 to 20 carbon atoms, with the proviso that at least one of $R^1$, $R^2$, $R^3$ and $R^4$ is $OR^5$, Y, $C(R_f)(R_f')OR^5$, $R^6Y$ or $OR^6Y$, and the proviso that if $R^1$ (or $R^3$) is OH, $R^2$ (or $R^4$) is not OH or halogen.

In a second aspect, the invention provides a photoresist composition comprising: (1) a fluorine-containing polymer comprising:

(a) at least one repeat unit derived from an ethylenically unsaturated compound having at least one fluorine atom covalently attached to an ethylenically unsaturated carbon atom; and (b) at least one repeat unit derived from an ethylenically unsaturated compound having the structure:

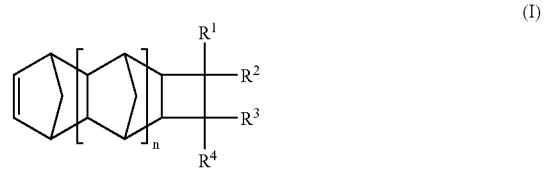

wherein n is 0, 1, or 2;

$R^1$, $R^2$, $R^3$ and $R^4$ are independently H, $OR^5$, halogen, alkyl or alkoxy of 1 to 10 carbon atoms, optionally substituted by halogen or ether oxygens, Y, $C(R_f)(R_f')OR^5$, $R^6Y$ or $OR^6Y$;

Y is COZ or $SO_2Z$;

$R^5$ is hydrogen or an acid-labile protecting group;

$R_f$ and $R_f'$ are the same or different fluoroalkyl groups of 1 to 10 carbon atoms or taken together are $(CF_2)_m$ where m is 2 to 10;

$R^6$ is an alkylene group of 1 to 20 carbon atoms, optionally substituted by halogen or ether oxygen;

Z is OH, halogen, or $OR^7$; and $R^7$ is an alkyl group of 1 to 20 carbon atoms, with the proviso that at least one of $R^1$, $R^2$, $R^3$ and $R^4$ is $OR^5$, Y, $C(R_f)(R_f')OR^5$, $R^6Y$ or $OR^6Y$, and the proviso that if $R^1$ (or $R^3$) is OH, $R^2$ (or $R^4$) is not OH or halogen; and (2) a photoactive component.

In a third aspect, the invention provides a coated substrate comprising:

(1) a substrate; and (2) a photoresist composition comprising:

(a) a fluorine-containing polymer comprising:

(i) at least one repeat unit derived from an ethylenically unsaturated compound having at least one fluorine atom covalently attached to an ethylenically unsaturated carbon atom; and (ii) at least one repeat unit derived from an ethylenically unsaturated compound having the structure:

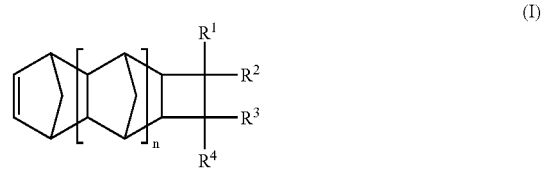

wherein n is 0, 1, or 2;

$R^1$, $R^2$, $R^3$ and $R^4$ are independently H, $OR^5$, halogen, alkyl or alkoxy of 1 to 10 carbon atoms, optionally substituted by halogen or ether oxygens, Y, $C(R_f)(R_f')OR^5$, $R^6Y$ or $OR^6Y$;

Y is COZ or $SO_2Z$;

$R^5$ is hydrogen or an acid-labile protecting group;

$R_f$ and $R_f'$ are the same or different fluoroalkyl groups of 1 to 10 carbon atoms or taken together are $(CF_2)_m$ where m is 2 to 10;

$R^6$ is an alkylene group of 1 to 20 carbon atoms, optionally substituted by halogen or ether oxygen;

Z is OH, halogen, or $OR^7$; and $R^7$ is an alkyl group of 1 to 20 carbon atoms, with the proviso that at least one of $R^1$, $R^2$, $R^3$ and $R^4$ is $OR^5$, Y, $C(R_f)(R_f')OR^5$, $R^6Y$ or $OR^6Y$, and the proviso that if $R^1$ (or $R^3$) is OH, $R^2$ (or $R^4$) is not OH or halogen; and (c) a photoactive component.

DETAILED DESCRIPTION

Fluorinated (Co)polymers

A fluorine-containing polymer or copolymer of this invention comprises at least one repeat unit derived from an ethylenically unsaturated compound having at least one fluorine atom covalently attached to an ethylenically unsaturated carbon atom, and at least one repeat unit derived from an ethylenically unsaturated compound having the structure:

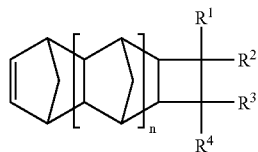
(I)

wherein n is 0, 1, or 2;

$R^1$, $R^2$, $R^3$ and $R^4$ are independently H, $OR^5$, halogen, alkyl or alkoxy of 1 to 10 carbon atoms, optionally substituted by halogen or ether oxygens, Y, $C(R_f)(R_f')OR^5$, $R^6Y$ or $OR^6Y$;

Y is COZ or $SO_2Z$;

$R^5$ is hydrogen or an acid-labile protecting group;

$R_f$ and $R_f'$ are the same or different fluoroalkyl groups of 1 to 10 carbon atoms or taken together are $(CF_2)_m$ where m is 2 to 10;

$R^6$ is an alkylene group of 1 to 20 carbon atoms, optionally substituted by halogen or ether oxygen;

Z is OH, halogen, or $OR^7$; and $R^7$ is an alkyl group of 1 to 20 carbon atoms, with the proviso that at least one of $R^1$, $R^2$, $R^3$ and $R^4$ is $OR^5$, Y, $C(R_f)(R_f')OR^5$, $R^6Y$ or $OR^6Y$, and the proviso that if $R^1$ (or $R^3$) is OH, $R^2$ (or $R^4$) is not OH or halogen.

Some illustrative, but nonlimiting, examples of representative monomers of structure (I) and within the scope of the invention are presented below:

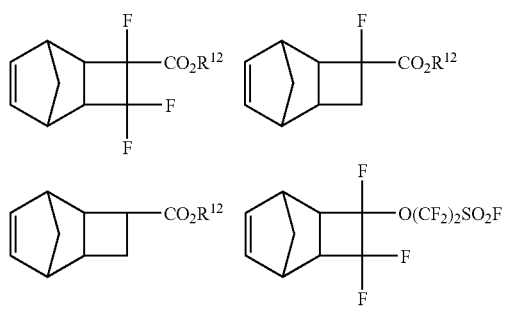

-continued

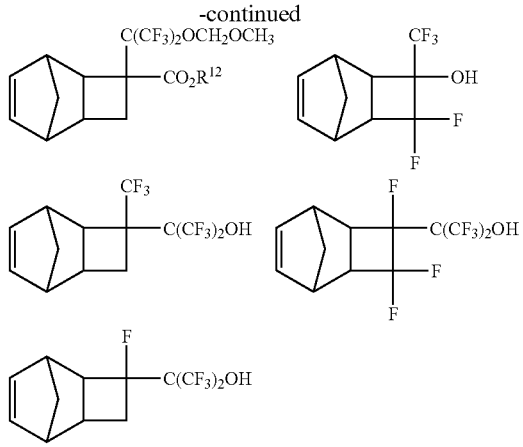

wherein $R^{12}$ is an alkyl group of 1 to 20 carbon atoms, more typically an alkyl group of 4 to 20 carbon atoms capable of forming or rearranging to a tertiary cation, and most typically tert-butyl.

Compounds of structure (I) wherein n=0 may be prepared by cycloaddition reaction of unsaturated compounds of structure (II) with quadricyclane (tetracyclo[2.2.1.0$^{2,6}$0$^{3,5}$]heptane) as shown in the equation below and illustrated by the examples.

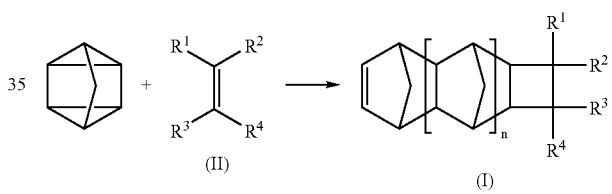

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of structure (I) with higher values of n (i.e., n=1 or 2) may be prepared by reaction of compounds of structure (I) with n=0 with cyclopentadiene as is known in the art. Compounds of structure (I) may also be formed from an intermediate wherein $R_5$ is a benzoate group. Such an intermediate can be the reaction product of quadracyclane and a fluoroalkylbenzoate, a specific example of which is 1,1,3,3,3 pentafluoro-2-propybenzoate. Typically, when aromatic intermediates are formed the aromatic group is removed by hydrolysis prior to polymerization.

The fluorine containing copolymer also comprises a repeat unit derived from at least one ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2$=$CFO(CF_2)_tCF$=$CF_2$, where t is 1 or 2, and $R_f''OCF=CF_2$ wherein $R_f''$ is a saturated fluoroalkyl group of from 1 to ten carbon atoms. A preferred comonomer is tetrafluoroethylene.

The copolymers of this invention may further comprise one or more additional comonomers. For example, the copolymer of this invention may also comprise a fluoroalcohol group. The fluoroalcohol group can be derived from at least one ethylenically unsaturated compound containing a fluoroalcohol group having the structure:

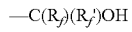
—C(R_f)(R_f')OH wherein $R_f$ and $R_f'$ are the same or different fluoroalkyl groups of from 1 to carbon atoms or taken together are $(CF_2)_m$ wherein m is 2 to 10. The phrase "taken together" indicates that $R_f$ and $R_f'$ are not separate, discrete fluorinated alkyl groups, but that together they form a ring structure such as is illustrated below for a 5-membered ring:

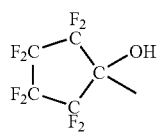

$R_f$ and $R_f'$ can be partially fluorinated alkyl groups without limit according to the invention except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. In preferred cases according to the invention, there will be sufficient fluorine substitution present in the fluorinated alkyl groups of the fluoroalcohol functional group such that the hydroxyl group will have a pKa value of 5<pKa<11. Preferably, $R_f$ and $R_f'$ are independently perfluoroalkyl groups of 1 to 5 carbon atoms, and, most preferably, $R_f$ and $R_f'$ are both trifluoromethyl ($CF_3$).

The fluorinated polymers, photoresists, and processes of this invention may further comprise a monomer containing a fluoroalcohol functional group having the structure:

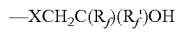
—XCH_2C(R_f)(R_f')OH wherein $R_f$ and $R_f'$ are as described above, X is an element from Group VA or Group VIA of the Periodic Table of the Elements (CAS Version), for example, oxygen, sulfur, nitrogen and phosphorous. Oxygen is the preferred X group.

Some illustrative, but nonlimiting, examples of representative comonomers containing a fluoroalcohol functional group and within the scope of the invention are presented below:

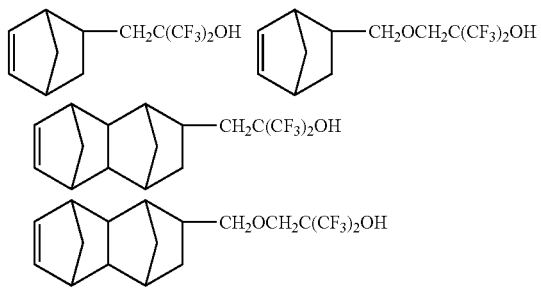

-continued

$CH_2=CHOCH_2CH_2OCH_2C(CF_3)_2OH$

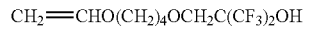
$CH_2=CHO(CH_2)_4OCH_2C(CF_3)_2OH$

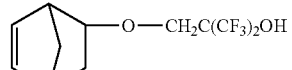

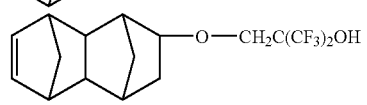

The copolymer can further comprise at least one acid-containing or protected acid-containing group of structural unit:

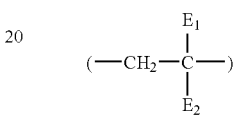

wherein $E_1$ is H or $C_1$-$C_{12}$ alkyl; $E_2$ is $CO_2E_3$, $SO_3E$, or other acidic group; and E and $E_3$ are independently selected from the group of H, unsubstituted $C_1$-$C_{12}$ alkyl, and heteroatom substituted $C_1$-$C_{12}$ alkyl. Suitable heteroatoms are oxygen, nitrogen, sulfur, halogen and phosphorus atoms. When the heteroatom is oxygen, the substituent may be a hydroxyl group, such as in 2-hydroxyethylacrylate, or an ether group, such as in 2-methoxyethyl acrylate. When the heteroatom is N, the substituent may be a cyano group, such as in 2-cyanoethyl acrylate. Alkyl groups can contain 1 to 12 carbon atoms and preferably 1 to 8 carbon atoms. A preferred acid-containing polymer for aqueous processability (aqueous development) in use, particularly as a binder in a photoresist composition, is a carboxylic acid-containing copolymer. The level of carboxylic acid groups is typically determined for a given photoresist composition by optimizing the amount needed for good development in aqueous alkaline developer. The additional monomers may be acrylates. Tertiary alkyl acrylates such as tert-butyl acrylate, 2-methyl-2-adamantyl acrylate and 2-methyl-2-norbornyl acrylate may provide acid sensitive functionality for image formation as discussed above. Other acrylates, such as acrylic acid, methyl acrylate, ethyl acrylate, propyl acrylate, 2-hydroxyethyl acrylate, 2-methoxyethyl acrylate, 2-cyanoethyl acrylate, glycidyl acrylate and 2,2,2-trifluoroethyl acrylate may be employed to modify the adhesion or solubility of the polymer, especially when used in a photoresist composition. In one embodiment tert-butylacrylate may be incorporated into the polymer to provide acid-labile tert-butyl ester groups.

Polar monomers such as vinyl acetate may also be incorporated into the copolymer in order to assist aqueous development or otherwise modify polymer properties.

The fluoro alcohol group and/or other acid group of the polymer can contain a protecting group that protects the fluorinated alcohol group and/or other acid group (i.e., the protected group) from exhibiting its acidity while in this protected form. As one illustrative example, the tertiary-butyl group is the protecting group in a tertiary-butyl ester and this protecting group protects the free acid. In undergoing deprotection (conversion of protected acid to free acid), the ester is converted to the corresponding acid.

An alpha-alkoxyalkyl ether group is a preferred protecting group for the fluoroalcohol group in order to maintain a high degree of transparency in the photoresist composition. The resulting protected fluoroalcohol group has the structure:

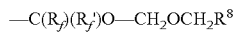

In this protected fluoroalcohol, $R_f$ and $R_f'$ are as described above; $R^8$ is hydrogen or a linear or branched alkyl group of 1 to 10 carbon atoms. An illustrative, but non-limiting, example of an alpha-alkoxyalkyl ether group that is effective as a protecting group in a protected acid group, is methoxy methyl ether (MOM). A protected fluoroalcohol with this particular protecting group can be obtained by reaction of chloromethylmethyl ether with the fluoroalcohol.

The fluoroalcohol functional group (protected or unprotected) of this invention can be used alone or it can be used in combination with one or more other acid groups, such as a carboxylic acid functional group (unprotected) or the t-butyl ester of a carboxylic acid functional group (protected).

In this invention, often, but not always, the components having protected groups are repeat units having protected acid groups that have been incorporated into the polymer. Frequently, the protected acid groups are present in one or more comonomer(s) that are polymerized to form the copolymer of this invention. Alternatively, in this invention, a copolymer can be formed by copolymerization with an acid-containing comonomer and then subsequently acid functionality in the resulting acid-containing copolymer can be partially or wholly converted by appropriate means to derivatives having protected acid groups.

The preferred process for polymerizing the fluorine-containing copolymers of this invention is radical addition polymerization. Any suitable polymerization initiator, such as di-(4-tert-butylcyclohexyl)peroxy-dicarbonate, can be used under appropriate conditions. The polymerization pressure can range from about 50 to about 10,000 psig, preferably from about 200 to about 1,000 psig. The polymerization temperature can range from about 30° C. to about 120° C., preferably from about 40° C. to about 80° C. Suitable solvents include 1,1,2-trichlorofluoroethane and non-chlorofluorocarbon solvents such as 1,1,1,3,3-pentafluorobutane. The polymerization process is further enhanced by a semi-batch synthesis. In the semibatch synthesis, a part of the monomer mixture is placed in the reaction vessel and then, portionwise or continuously, the remaining monomers and initiator are added to the vessel throughout the polymerization process.

Photoresist Development

Protective Groups for Removal by PAC Catalysis

Photoactive Component (PAC)

The photoresist compositions of this invention may contain at least one photoactive component (PAC) that can produce either acid or base upon exposure to actinic radiation during the development process. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure III), 2) iodonium salts (structure IV), and 3) hydroxamic acid esters, such as structure V.

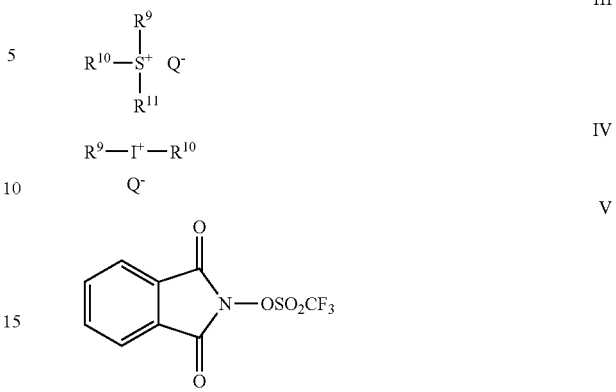

In structures III to IV, $R^9$ to $R^{11}$ are, independently, substituted or unsubstituted $C_6$ to $C_{20}$ aryl, or substituted or unsubstituted $C_7$-$C_{40}$ alkylaryl or aralkyl. Representative aryl groups include, but are not limited to, phenyl, naphthyl, and anthracenyl. Suitable heteroatom substituents include, but are not limited to, one or more oxygen, nitrogen, halogen or sulfur atoms. When the heteroatom is oxygen, the substituent may contain hydroxyl (—OH) or $C_1$-$C_{20}$ alkyloxy (e.g., $C_{10}H_{21}O$). The anion $Q^-$ in structures III-IV can be, but is not limited to, $SbF_6^-$ (hexafluoroantimonate), $CF_3SO_3^-$ (trifluoromethylsulfonate=triflate), and $C_4F_9SO_3^-$ (perfluorobutylsulfonate).

Functionality for Development

For use in a photoresist composition, the fluorine-containing copolymer should contain sufficient functionality to render the photoresist developable so as to produce a relief image, following imagewise exposure to ultraviolet radiation having wavelength of $\leq 365$ nm. In some preferred embodiments, the sufficient functionality is selected from an acid and/or a protected acid group, as described above. Such acid or protected acid groups have been found to render the exposed portions of photoresist soluble in basic solution upon exposure to sufficient ultraviolet radiation having a wavelength of $\leq 365$ nm, while the unexposed portions are insoluble in the basic solution.

For development, one or more groups within the fluorine-containing copolymers should contain one or more components having protected acid groups that can yield, by catalysis of acids or bases generated photolytically from the photoactive compound (PAC), hydrophilic acid or base groups.

A given protected acid group is one that is normally chosen on the basis of its being acid labile, such that when photoacid is produced upon imagewise exposure, the acid will catalyze deprotection of the protected acid group and production of hydrophilic acid groups that are necessary for development under aqueous conditions. In addition, the fluorine-containing copolymers may also contain acid functionality that is not protected.

Examples of basic developer include, but are not limited to, sodium hydroxide, potassium hydroxide, and ammonium hydroxide solutions. Typically, a basic developer is an aqueous alkaline liquid such as a wholly aqueous solution containing 0.262 N tetramethylammonium hydroxide (with development at 25° C. usually for $\leq 120$ seconds) or 1% sodium carbonate by weight (with development at a temperature of 30° C. usually $\leq 2$ minutes).

When an aqueous processable photoresist is coated or otherwise applied to a substrate and imagewise exposed to UV light, development of the photoresist composition may require that the binder material contains sufficient acid groups (e.g., carboxylic acid groups) and/or protected acid groups that are at least partially deprotected upon exposure to render the photoresist (or other photoimageable coating composition) processable in aqueous alkaline developer.

In one embodiment of the invention, the copolymer having one or more protected acid groups yields a carboxylic acid as the hydrophilic group upon exposure to photogenerated acid. Such protected acid groups include, but are not limited to, A) esters capable of forming, or rearranging to, a tertiary cation, B) esters of lactone, C) acetal esters, D) β-cyclic ketone esters, E) α-cyclic ether esters, and F) MEEMA (methoxy ethoxy ethyl methacrylate) and other esters which are easily hydrolyzable because of anchimeric assistance. Some specific examples in category A) are t-butyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

A typical acidic group is the hexafluoroisopropanol group which may be incorporated by use of hexafluoroisopropanol-containing monomers as illustrated by the examples. Some or all of the hexafluoroisopropanol groups may be protected as, for example, acid-labile alkoxymethyl ethers or tert-butylcarbonates.

Examples of components having protected acid groups that yield an alcohol as the hydrophilic group upon exposure to photogenerated acid or base include, but are not limited to, t-butoxycarbonyl (t-BOC), t-butyl ether, and 3-cyclohexenyl ether.

In the case of a negative-working photoresist layer, the photoresist layer will be removed during development in portions which are unexposed to UV radiation but will be substantially unaffected in exposed portions during development using either a supercritical fluid or an organic solvent.

Dissolution Inhibitors and Additives

Various dissolution inhibitors can be utilized in this invention. Ideally, dissolution inhibitors (DIs) for far and extreme UV resists (e.g., 193 nm resists) should be designed or chosen to satisfy multiple materials needs, including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", *J. Electrochem. Soc.* 1983, 130, 1433-1437.) Bile-salt esters are particularly attractive choices as DIs for several reasons, including their availability from natural sources, their high alicyclic carbon content, and particularly for their transparency in the deep and vacuum UV region of the electromagnetic. Furthermore, the bile-salt esters are also attractive DI choices since they may be designed to have a wide range of hydrophobic or hydrophilic compatibilities, depending upon hydroxyl substitution and functionalization.

Representative bile-acids and bile-acid derivatives that are suitable as additives and/or dissolution inhibitors for this invention include, but are not limited to, cholic acid, deoxycholic acid, lithocholic acid, t-butyl deoxycholate, t-butyl lithocholate, and t-butyl-3-α-acetyl lithocholate.

The invention is not limited to use of bile-acid esters and related compounds as dissolution inhibitors. Other types of dissolution inhibitors, such as various diazonaphthoquinones (DNQs) and diazocoumarins (DCs), can be utilized in this invention in some applications. Diazanaphthoquinones and diazocoumarins are generally suitable in resists compositions designed for imaging at higher wavelengths of UV light (e.g., 365 nm and perhaps at 248 nm). These dissolution inhibitors are generally not preferred in resist compositions designed for imaging with UV light at 193 nm or lower wavelengths, since these compounds absorb strongly in this region of the UV and are usually not sufficiently transparent for most applications at these low UV wavelengths.

Solvents:

Photoresists of this invention are prepared as coating compositions by dissolving the components of the photoresist in a suitable solvent, including: ether esters such as propyleneglycol monomethyl ether acetate, 2-ethoxyethyl acetate, 2-methoxyethyl acetate, ethyl 3-ethoxypropionate, and the like; ketones such as cyclohexanone, 2-heptanone, methyl ethyl ketone, and the like; esters such as butyl acetate, ethyl lactate, methyl lactate, ethyl acetate, and the like; glycol ethers such as, propylene glycol monomethyl ether, ethylene glycol monomethyl ether, ethyleneglycol monoethyl ether, 2-methoxyethyl ether (diglyme), and the like; unsubstituted and substituted aromatic hydrocarbons such as toluene, chlorobenzene, and the like; and fluorinated solvents such as CFC-113 (1,1,2-trichlorotrifluoromethane, E. I. du Pont de Nemours and Company), 1,2-bis(1,1,2,2-tetrafluoroethoxy)ethane, and the like. A high boiling solvent may be added, including: an unsubstituted or substituted aromatic hydrocarbon, such as xylene and the like; an ether such as benzyl ethyl ether, dihexyl ether, and the like; a glycol ether such as diethyleneglycol monomethyl ether, diethyleneglycol monoethyl ether, and the like; a ketone such as acetonylacetone, isophorone, and the like; an alcohol such as 1-octanol, 1-nonanol, benzylalcohol, and the like; an ester such as benzyl acetate, ethyl benzoate, diethyl oxalate, diethyl maleate, ethylene carbonate, propylene carbonate, and the like; and a lactone such as γ-butyrolactone, δ-valerolactone, and the like. Alternately, super critical $CO_2$ may be useful as a solvent. These solvents may be used alone or in admixture of two or more. Typically, the solids content of the photoresist varies between 5 and 50% by weight of the total weight of the photoresist composition.

Other Components

The compositions of this invention can contain optional additional components. Examples of additional components which can be added include, but are not limited to, bases, surfactants, resolution enhancers, adhesion promoters, residue reducers, coating aids, plasticizers, and $T_g$ (glass transition temperature) modifiers.

Process Steps

For microlithography, the photoresist composition is applied to a suitable substrate such as a microelectronic wafer typically employed in the semiconductor industry. Examples include, but are not limited to, silicon and SiON wafers. The solvent is then removed by evaporation.

Imagewise Exposure

The photoresist compositions of this invention are sensitive in the ultraviolet region of the electromagnetic spectrum and especially to those wavelengths ≦365 nm. Imagewise exposure of the photoresist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths; is more preferably done with ultraviolet light of 193 nm, 157 nm, or lower wavelengths; and is still more preferably done with ultraviolet light of 157 nm or lower wavelengths. Imagewise exposure can either be done digitally with a laser or equivalent device, or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher). Specifically, imaging at 157 nm is preferred over imaging at 193 nm for this reason.

The present photoresists are useful for 365 nm (I-line), 248 nm (KrF laser), and especially 193 nm (ArF laser) and 157 nm (F2 laser) microlithography. These photoresists are critical in allowing for the imaging of feature sizes in the submicrometer range.

Substrate

The substrate employed in this invention can illustratively be silicon, silicon oxide, silicon oxynitride, silicon nitride, or various other materials used in semiconductive manufacture. In a preferred embodiment, the substrate can be in the form of a microelectronic wafer. The microelectronic wafer can be prepared from be silicon, silicon oxide, silicon oxynitride, and silicon nitride.

| GLOSSARY | |
|---|---|
| Analytical/Measurements | |
| bs | broad singlet |
| δ | NMR chemical shift measured in the indicated solvent |
| g | gram |
| h | hours |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| $T_g$ | Glass Transition Temperature |
| $M_n$ | Number-average molecular weight of a given polymer |
| $M_w$ | Weight-average molecular weight of a given polymer |
| $P = M_w/M_n$ | Polydispersity of a given polymer |

-continued

| GLOSSARY | |
|---|---|
| Absorption coefficient | AC = A/b, where A, absorbance, = Log$_{10}$(1/T) and b = film thickness in microns, where T = transmittance as defined below. |
| Transmittance | Transmittance, T, = ratio of the radiant power transmitted by a sample to the radiant power incident on the sample and is measured for a specified wavelength λ (e.g., nm). |
| RT | Room Temperature |
| Chemicals/Monomers | |
| CFC-113 | 1,1,2-Trichlorotrifluoroethane E. I. du Pont de Nemours and Company, Wilmington, DE |
| DMF | Dimethylformamide |
| MAdA | 2-Methyl-2-adamantyl acrylate OHKA America, Inc., Milpitas, CA |
| NB—F—OH | 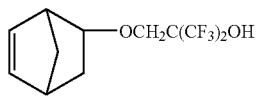 |
| Perkadox ® 16 N | Di-(4-tert-butylcyclohexyl)peroxydicarbonate Noury Chemical Corp., Burt, NY |
| Solkane ® 365 mfc | 1,1,1,3,3-Pentafluorobutane Solvay Fluor, Hannover, Germany |
| t-BuAc | tert-Butyl acrylate Aldrich Chemical Company, Milwaukee, WI |
| TCB | Trichlorobenzene Aldrich Chemical Co., Milwaukee, WI |
| TCN-(F)2(F, CO2t-Bu) | 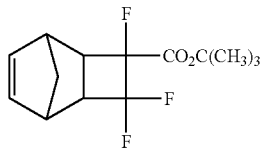 |
| TCN-(F, CO2t-Bu) | 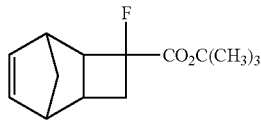 |
| TCN-(CO2t-Bu) | 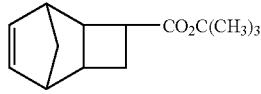 |
| TCN-(CO(O)CH3, C(CF3)2OCH2OCH3) | 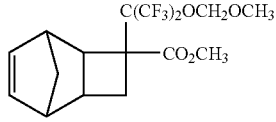 |
| TCN-(F)2(CF3, OH) | 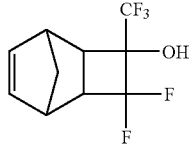 |
| TCN-(CF3, C(CF3)2OH) | 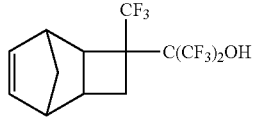 |

-continued

GLOSSARY

| | |
|---|---|
| TCN-(F)2(F, C(CF3)2OH) | (structure: norbornene fused cyclobutane with two F and C(CF$_3$)$_2$OH substituents) |
| TCN-(F, C(CF3)2OH) | (structure: norbornene fused cyclobutane with F and C(CF$_3$)$_2$OH substituents) |
| TFE | Tetrafluoroethylene<br>E. I. du Pont de Nemours and Company, Wilmington, DE |
| THF | Tetrahydrofuran<br>Aldrich Chemical Co., Milwaukee, WI<br>Ultraviolet |
| Extreme UV | Region of the electromagnetic spectrum in the ultraviolet that ranges from 10 nm to 200 nm |
| Far UV | Region of the electromagnetic spectrum in the ultraviolet that ranges from 200 nm to 300 nm |
| UV | Ultraviolet region of the electromagnetic spectrum which ranges from 10 nm to 390 nm |
| Near UV | Region of the electromagnetic spectrum in the ultraviolet that ranges from 300 nm to 390 nm |

EXAMPLES

Unless otherwise specified, all temperatures are in degrees Celsius, all mass measurements are in grams, and all percentages are weight percentages, except for polymer compositions, which are expressed as mole % of the constitutent monomer repeat units.

Glass transition temperatures ($T_g$) were determined by DSC (differential scanning calorimetry) using a heating rate of 20° C./min, data is reported from the second heat. The DSC unit used is a Model DSC2910 made by TA Instruments, Wilmington, Del.

Assessment of 157 nm imaging sensitivity can be done using a Lambda-Physik Compex 102 excimer laser configured for 157 nm operation. Vacuum ultraviolet transmission measurements are made using a McPherson spectrometer equipped with a $D_2$ light source. Samples are spin-coated at several thicknesses on CaF$_2$ substrates, and the contribution of the substrate to the transmission is approximately removed by spectral division.

More specifically, all absorption coefficient measurements for polymers can be made using the procedure listed below.

1. Samples are first spin-coated on silicon wafers on a Brewer Cee (Rolla, Mo.), Spincoater/Hotplate model 100CB.
  a) Two to four silicon wafers are spun at different speeds (e.g., 2000, 3000, 4000, 6000 rpm) to obtain differing film thickness and the coated wafers are subsequently baked at 120° C. for 30 min. The dried films are then measured for thickness on a Gaertner Scientific (Chicago, Ill.), L116A Ellipsometer (400 to 1200 angstrom range). Two spin speeds are then selected from this data to spin the CaF$_2$ substrates for the spectrometer measurement.
  b) Two CaF$_2$ substrates (1" dia.×0.80" thick) are selected and each is run as a reference data file on a McPherson Spectrometer (Chemsford, Mass.), 234/302 monochrometer, using a 632 Deuterium Source, 658 photomultiplier, and Keithley 485 picoammeter.
  c) Two speeds are selected from the silicon wafer data a) to spin the sample material onto the CaF$_2$ reference substrates (e.g., 2000 and 4000 rpm) to achieve the desired film thickness. Then each is baked at 120° C. for 30 min. and the sample spectra is collected on the McPherson Spectrometer; the sample files are then divided by the reference CaF$_2$ files.
  d) The resulting absorbance files are then adjusted (sample film on CaF$_2$ divided by CaF$_2$ blank) for film thickness to give absorbance per micron (abs/mic), which is done using GRAMS386 and KALEIDA-GRAPH software.

The term "clearing dose" indicates the minimum exposure energy density (e.g., in units of mJ/cm$^2$) to enable a given photoresist film, following exposure, to undergo development.

Example 1

Preparation of TCN—(CO2t-Bu)

TCN—(CO2t-Bu) was prepared by heating a mixture of 100 mL of t-Bu-acrylate with 88 g of quadricyclane at 90° C. for 96 h. Distillation of crude product (159 g) afforded 27 g (14%) of TCN—(CO2t-Bu); b.p. 79-83° C./1.3 mm.

Example 2

Preparation of TCN—(F)2(F, CO2-t-Bu)

A Fischer/Porter glass pressure vessel was charged with quadricyclane (15.1 g, 163 mmol) and a stirring bar. The liquid was cooled to −78° C. and the vessel was evacuated. Trifluoroacryloyl fluoride (19 g, 150 mmol) was condensed in a gas trap and transferred under vacuum to the vessel. The stirred contents were allowed to warm slowly. The mixture was heated at 45° C. for 36 hr. The mixture was cooled to room temperature and a small volume of low-boiling material was transferred to a trap under vacuum. Crude adduct acid fluoride was treated with ether (70 mL) and added by canula to a 3-neck flask (under N$_2$) fitted with thermo-well, stir bar, and addition port. The solution was cooled to −20° C. and treated portion-wise with a solution of potassium t-butoxide (17.7 g, 150 mmol) in ether (130 mL)/THF (40 mL), keeping the reaction temperature at −15° C. during addition (40 min). The mixture was allowed to warm slowly to room temperature. The reaction mixture was cooled in ice, then added to a mixture of ether (400 mL) and ice water (400 mL). The pH of aqueous phase was ca. 8; the organic layer was washed with brine, and dried (Na$_2$SO$_4$, MgSO$_4$), and stripped. Kugelrohr distillation gave 35.6 g (87%) of colorless oil, bp 50-65° C. To ensure that the monomer sample was free of higher-boiling residue, it was re-distilled to give 35.0 g of material. $^1$H NMR (C$_6$D$_6$): 5.73-5.62 (m, a=2.00), 3.35 (bd s, a=0.64), 2.81-2.72 (overlapping m, a=1.72), 2.42-2.28 (m, a=1.01), 2.12-2.06 (m) and 2.50-1.99 (overlapping m, a=1.03), 1.69 (d, down-field portion of AB pattern, J=9.8 Hz, a=0.63), 1.34 (s, a=3.55, OC(CH$_3$)$_3$, minor isomer), 1.28 (s, OC(CH$_3$)$_3$, major isomer) and 1.25

(d, up-field portion of AB pattern, major isomer, combined a=6.92), 1.15 (d, up-field portion of AB pattern, minor isomer, a=0.40). $^{19}$F NMR (C$_6$D$_6$) showed 2 AB patterns, −101.86 (ddd, J=5.4, 14.2, 216, a=35.5, minor isomer), −107.05 (dddd, J=2.7, 6.0, 16.3, 218, a=62.9, major isomer), up-field branches at −119.00 (J=2.7, 217, a=63.3), −120.8 (d of m's, J=3.8, 216, a=36.3), −160.67 (d of m's J=2.2, 26.7, a=59.9), −186.76 (m, a=34.1). Spectra were consistent with a ca. 63/37 mixture of stereoisomeric adducts. GC/MS showed two components, 2/1 ratio, which exhibited very similar fragmentation patterns and showed M$^+$ with m/e=274 and M-CH$_3$ ions consistent with the desired t-butyl esters.

Example 3

Preparation of TCN—(C(O)OCH3, C(CF3)2OCH2OCH3)

A mixture of 29 g (0.1 mol) of CH$_2$=CC(O)OCH$_3$[C(CF$_3$)$_2$OCH$_2$OCH$_3$] and 11 mL of quadricyclane (80% purity, the remainder is norbornadiene) was refluxed at 90-110° C. for 48 h. Distillation of the reaction mixture gave 14 g (47%) of TCN—(C(O)OCH3, C(CF3)2OCH2OCH3), b.p. 120-122° C./0.65 mm. IR:1738 (C=O) cm$^{-1}$.

Example 4

Preparation of TCN—(F—CO2t-Bu)

A mixture of 30 g CH2=CFC(O)F (containing 35% DMF) (0.22 mol) and 35 mL of quadricyclane in 100 mL of dry ether was kept at 100° C. for 16 h. Crude reaction mixture was fractionated to give 25 g (80% purity, 52% yield) of cycloadduct b.p. 57-82° C./20 mm. This material was dissolved in 50 mL of dry DMF, cooled to −20° C. and a solution of 13 g of dry potassium t-butoxide in 100 mL of dry DMF was slowly added at a rate keeping the internal temperature at −20 to −15° C. The reaction mixture was warmed to room temperature and agitated overnight. The reaction mixture was diluted with 500 mL of water and extracted with CH$_2$Cl$_2$ (1×100 mL and 1×50 mL). The combined organic layers were washed with a solution of 50 mL of hydrochloric acid in 500 mL of water (3×150 mL) and dried over MgSO$_4$. The solvent was removed under vacuum and the residue was distilled to give 8.9 g of fraction b.p. 85-94° C./0.55 mm (80% purity TCN—(F—CO2t-Bu), the remainder DMF) and 11.5 g of TCN—(F, CO2t-Bu) as a mixture of two isomers (ratio 3:1); b.p. 94-96° C./0.55 mm Hg. $^{19}$F NMR: −145.16 (m) major; −170.54 (m) minor.

Example 5

Synthesis of a TFE, NB—F—OH and TCN—(F)2(F, CO2t-Bu) Polymer

A 200 mL stainless steel pressure vessel was charged with 36.5 g NB—F—OH, 32.9 g of TCN—(F)2(F, CO2t-Bu), 50 mL of Solkane® 365 mfc and 2.55 g of Perkadox® 16N initiator. The vessel was closed, cooled in dry ice, purged with nitrogen, evacuated, and charged with 45.5 g of TFE. The vessel was then agitated with its contents at 50° C. for 18 hr while the internal pressure decreased from 363 to 336 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours and then dried overnight in a vacuum oven with slight nitrogen purge at 88-90° C. There was isolated 42.5 g of white polymer; GPC analysis: M$_n$ 3500, M$_w$ 7200. T$_g$ 195° C. (DSC). Anal. Found: C, 46.10; H, 3.86; F, 39.14. $^{19}$F NMR (δ, CDCl$_3$)-77.6 (6F from NB—F—OH), −95 to −125 (4F from TFE and 2F from TCN—(F)2(F, CO2-t-Bu)), −160 and −187 (1F from TCN—(F)2(F, CO2-t-Bu)).

Example 6

Synthesis of a TFE, NB—F—OH and TCN—(CO2t-Bu) Polymer

A 200 mL stainless steel pressure vessel was charged with 46.4 g NB—F—OH, 26.4 g of TCN—(CO2t-Bu), 50 mL of Solkane® 365 mfc and 2.55 g of Perkadox® 16N initiator. The vessel was closed, cooled in dry ice, purged with nitrogen, evacuated, and charged with 52 g of TFE. The vessel was then agitated with its contents at 50° C. for 18 hr while the internal pressure decreased from 383 to 363 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours and then dried overnight in a vacuum oven with slight nitrogen purge at 88-90° C. There was isolated 19.3 g of white polymer; GPC analysis: M$_n$ 4900, M$_w$ 6700. T$_g$ 162° C. (DSC). Anal. Found: C, 51.52; H, 4.72; F, 32.53.

Example 7

Synthesis of a TFE and TCN—(C(O)OCH3, C(CF3)2OCH2OCH3) Polymer

A 75 mL stainless steel pressure vessel was charged with 13.8 g of TCN—(CO(O)CH3, C(CF3)2OCH2OCH3), 25 mL of Solkane® 365 mfc and 0.32 g of Perkadox® 16N initiator. The vessel was closed, cooled in dry ice, purged with nitrogen, evacuated, and charged with 6 g of TFE. The vessel was then agitated with its contents at 50° C. for 18 hr while the internal pressure decreased from 193 to 180 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours, and then dried overnight in a vacuum oven with slight nitrogen purge at 88-90° C. There was isolated 1.3 g of white polymer; GPC analysis: M$_n$ 3100, M$_w$ 5300. T$_g$ 155° C. (DSC). Anal. Found: C, 46.57; H, 3.96; F, 34.42.

Example 8

Synthesis of a TFE, NB—F—OH and TCN—(F, CO2t-Bu) Polymer

A 200 mL stainless steel pressure vessel was charged with 40.6 g NB—F—OH, 21.7 g of TCN—(F, CO2-t-Bu), 50 mL of Solkane® 365 mfc and 2.23 g of Perkadox® 16N initiator. The vessel was closed, cooled in dry ice, purged with nitrogen, evacuated, and charged with 45.5 g of TFE. The vessel was then agitated with its contents at 50° C. for 18 hr while the internal pressure decreased from 345 to 304 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours, and then dried overnight in a vacuum oven with slight nitrogen purge at 88-90° C. There was isolated 23.6 g of white polymer; GPC analysis: $M_n$ 4700. $M_W$ 10000. $T_g$ 171° C. (DSC). Anal. Found: C, 48.14; H, 4.34; F,36.48. $^{19}$F NMR (δ, CDCl$_3$) −75.7 (6F from NB—F—OH), −95 to −125 (4F from TFE), −139 to −143 and −166 to −169 (1F from TCN—(F, CO$_2$tBu).

Example 9

The following solution was prepared and magnetically stirred overnight.

| Component | Wt. (gm) |
|---|---|
| TFE/NB—F—OH/TCN—(F)2(F, CO2t-Bu) polymer in Example 5 | 2.964 |
| 2-Heptanone | 20.749 |
| 6.82% (wt) solution of triphenylsulfonium nonaflate dissolved in 2-heptanone which had been filtered through a 0.45 μm PTFE syringe filter. | 2.287 |

Spin coating was done using a Brewer Science Inc. Model-100CB combination spin coater/hotplate on a 4 in. diameter Type "P", <100> orientation, silicon wafer. Development was performed on a Litho Tech Japan Co. Resist Development Analyzer (Model-790).

The wafer was prepared by depositing 6 mL of hexamethyldisilazane (HMDS) primer and spinning at 5000 rpm for 10 seconds. Then about 2-3 mL of the above solution, after filtering through a 0.45 μm PTFE syringe filter, was deposited and spun at 2500 rpm for 60 seconds and baked at 150° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 45 mJ/cm$^2$. By using a mask with 18 positions of varying neutral optical density, a wide variety of exposure doses were generated. After exposure the exposed wafer was baked at 125° C. for 60 seconds.

The wafer was developed in aqueous tetramethylammonium hydroxide (TMAH) solution (Shipley LDD-26W, 0.26N solution) for 60 seconds, resulting in a positive image.

Example 10

Preparation of TCN—(F)2(CF3, OH)

A Fisher/Porter glass pressure vessel was charged with quadricyclane (1.0 g, 10.9 mmol) and 1,1,3,3,3-pentafluoro-2-propenyl benzoate (2.52 g, 10 mmol). The sealed vessel was heated at 110° C. for 24 hr, then at 120° C. for 9 days. The cooled mixture was subjected to kugelrohr distillation to provide 0.83 g of starting 1,1,3,3,3-pentafluoro-2-propenyl benzoate and 1.63 g of colorless oil, bp 98-100° C./0.05 mm. $^{19}$F NMR (C$_6$D$_6$) showed: −67.93 (d, J=11.4, a=0.12), −72.98 (dd, J=16.9, 1.6, a=0.13), two AB patterns: −99.0 (J=214.7, and doublet couplings of 6.0 Hz, 14.7 Hz, a=0.042), −118.81 (J=215, several other couplings, a=0.041), and −101.6 (J=222, along with doublet of quartets, J=6.0, 17.4, a=0.044), −114.82 (J=221, other couplings not resolved, a=0.046). $^1$H NMR (C$_6$D$_6$): 8.10 and 8.02 (m's, a=2.00, ortho H's), 7.06 (m) and 7.00 to 6.92 (m, combined a=3.12), 2 sets of vinyl signals 5.73, 5.68, and 5.62-5.56 (a=2.03), 3.16 and 3.14 (overlapping bd singlets, a=1.00, bridgehead), 2.75 (bd s, overlapping m, a=0.95), 2.66 (bd s, a=0.52), 2.58-2.47 (overlapping m's, a=1.02), 2.27 (m, a=0.54), 2 sets of CH$_2$ AB patterns, 2.09, 1.15 (d, J=10.1 Hz), and 1.72, 1.00 (d, J=9.7 Hz). $^1$H and $^{19}$F NMR data are in accord with TCN—(F)2(CF3, OC(O)C$_6$H$_5$), the cyclo adduct of quadricyclane and 1,1,3,3,3-pentafluoro-2-propenylbenzoate.

The distilled sample of TCN—(F)2(CF3, OC(O)C$_6$H$_5$) obtained as described above (1.63 g, 4.71 mmol) was added to a solution of potassium hydroxide (0.80 g, 12 mmol) in methanol (15 mL) and water (10 mL). The mixture was stirred rapidly at room temperature for 4.5 hr. Most of the methanol was removed under reduced pressure. Water (15 mL) was added and the pH was adjusted to ca. 7.0 by addition of hydrochloric acid. Product was extracted with methylene chloride (2×20 mL) and the extract was dried and stripped to give 1.07 g of nearly colorless oil. $^{19}$F NMR (C$_6$D$_6$): −74.02 (d, J=7.1 Hz, a=2.77), −79.25 (dd, J=2.0, 14.7), two sets of AB patterns, −103.05 (ddd, J=6.5, 13.7, 213, a=0.93), −105.34 (dddq, J=218, 15, 5.4, 15, a=1.02), −119.19 (d, J=217.5, a=1.01), −123.07 (d of m's, J=213, a=0.93). $^1$H NMR (C$_6$D$_6$): 5.67 (dd, J=3.3, 5.8) and 5.54 (J=3.3, 5.8, vinyl signals for isomer A), 5.62 ($2^{nd}$ order AB pattern, combined vinyl signal area=2.00), 2.80 (bd s, a=0.49) 2.69 (m) and 2.67 (s, combined a=1.51), 2.46 (bd s, a=0.50), 2.28 (m, a=0.50), 2.16 (m, a=0.55), 2.02 to 1.96 (overlapping m, a=1.02), 1.93 (bd s, a=0.51), 1.81 (d, J=10, a=0.53), 1.71 (overlapping d's, J ca. 7.2, a=0.48), 1.11(d, J ca. 10) and 1.08 (d, J ca. 10, combined a=1.02). Consistent with nearly 50/50 mixture of 2 isomers containing the exo ring geometry of TCN—(F)2(CF3, OH).

In a second preparation of the title monomer, a Fisher/Porter glass pressure vessel was charged with quadricyclane (18.0 g, 195 mmol) and 1,1,3,3,3-pentafluoro-2-propenyl benzoate (32.86 g, 130.3 mmol). The sealed vessel was heated at 125° C. for 144 hr. The reaction mixture was cooled, and residual C$_7$H$_8$ was removed under reduced pressure. Kugelrohr distillation provided 13.5 g of lower-boiling liquid, bp 23-60° C./0.05 mm (41% of initial charge of 1,1,3,3,3-pentafluoro-2-propenyl benzoate) and 27.3 g of colorless oil, b.p. 92-97° C./0.03 mm (60.9% of theory). $^{19}$F and $^1$H NMR spectra were as described above and in accord with TCN—(F)2(CF3, OC(O)C$_6$H$_5$).

The distilled sample of TCN—(F)2(CF3, OC(O)C$_6$H$_5$) obtained as described above (27.3 g, 79.1 mmol) was added to a solution of potassium hydroxide (13.35 g, 203 mmol) in methanol (250 mL) and water (167 mL). The mixture was stirred rapidly at room temperature for 4.5 hr. Most of the methanol was removed under reduced pressure. Water (150 mL) was added and the pH was adjusted to ca. 7.0 by addition of hydrochloric acid. Product was extracted with methylene chloride (3×150 mL) and the extract was dried and stripped to give 20.7 g almost colorless oil. Kugelrohr distillation gave 19.6 g (ca. 100%) of colorless oil, bp 35°-38° C./0.05 mm. $^{19}$F NMR and $^1$H NMR recorded as described above were consistent with a nearly 50/50 mixture of 2 isomers containing the exo ring geometry of TCN—(F)2(CF3, OH).

Example 11

Preparation of TCN—(CF3, C(CF3)2OH)

a) Preparation of CH$_2$=C(CF$_3$)C(O)Cl:

To 45 g of phthaloyl dichloride placed in round-bottom flask, equipped with distillation head, was added 28 g of CH$_2$=C(CF$_3$)C(O)OH (98%, Synquest Laboratories, Alachua, Fla., USA). The reaction mixture was heated up to 150° C. with simultaneous distillation of the product, which was collected [28 g (88%) of fraction 86-100° C.], and used in the next step without further purification.

b) Reaction of CH$_2$=C(CF$_3$)C(O)Cl with quadricyclane:

To the solution of 22 g of quadricyclane in 100 mL of dry ether, 28 g of CH$_2$=C(CF$_3$)C(O)Cl was added at 10-20° C. (The reaction is exothermic). The reaction mixture was kept at 25-35° C. for 12 h. Then the solvent was removed under vacuum and the residue was distilled under reduced pressure to give 36 g (71%) of cycloadduct A

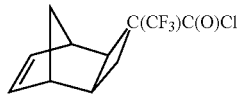
A b.p. 102-108° C./15 mmHg. Found: C, 52.25; H. 3.89, F, 22.49.

c) Preparation of TCN—(CF3, C(CF3)2OH):

To the mixture of 65 g of dry CsF and 100 mL of dry acetontrile placed in 1 L flask equipped with thermometer, addition funnel and dry-ice condenser was slowly added the solution of A in 200 mL of dry CH$_3$CN. The reaction mixture was agitated 1 h at ambient temperature and cooled down to +10° C., and then 110 g of trifluoromethyltrimethylsilane (Synquest Laboratories) was added slowly at 10-15° C. The reaction mixture was brought to ambient temperature and agitated for 14 h. 400 mL of 10% hydrochloric acid was slowly added to the reaction mixture at 15-20° C. (pH<1). The reaction mixture was extracted with CH$_2$Cl$_2$ (3×100 mL), the combined organic layers were dried over MgSO$_4$ and then the solvent was removed under vacuum. The residue was distilled under reduced pressure to give 30 g (24%) of fraction b.p. 74-75° C./0.75 mm Hg of TCN—(CF3, C(CF3)2OH). According to NMR data, the product was a mixture of two isomers in the ratio of 60:40. $^{19}$F NMR (CDCl$_3$) major: −61.27(3F, m), −68.73(3F, m), −71.21(3F, m); minor: −70.55(3F, m), −71.35(3F, m), −72.56(3F, m). Found: C, 43.80; H, 3.20, F, 48.48.

Example 12

Preparation of TCN—(F)2(F, C(CF3)2OH).

Preparation of cycloadduct of quadricyclane and CF$_2$=CFC(O)F:

A Fischer/Porter glass pressure vessel was charged with quadricyclane (15.1 g, 163 mmol) and a stirring bar. The liquid was cooled to −78° C. and the vessel was evacuated. Trifluoroacryloyl fluoride (19 g, 150 mmol) was condensed in a gas trap and transferred under vacuum to the vessel. The stirred contents were allowed to warm slowly and then maintained at 45° C. for 24 hr. The mixture was cooled to room temperature and a small volume of low-boiling material was transferred from the reactor to a trap under vacuum. The remaining reaction mass was characterized cycloadduct B in purity estimated as >95% based on NMR analysis. $^{19}$F (C$_6$D$_6$) +36.35 (a=59.3, COF), +29.22 (a=33.9, COF), low-field portions of AB patterns at −100.15 (a=36.8) and −105.35 (a=64.2), up-field portions of AB patterns at −118.6 (major) and −119.25 (minor), CF at −165.87 (a=50.9) and −188.0 (a=31.1).

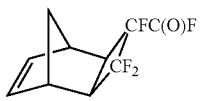
B b) Preparation of TCN—(F)2(F, C(CF3)2OH):

To the mixture of 35 g of dry CsF and 200 mL of dry THF placed in 500-ml flask equipped with thermometer, addition funnel and dry-ice condenser was slowly added the solution of B in 50 mL of dry THF and 49 g of trifluoromethyltrimethylsilane (Synquest) at 10-15° C. The reaction mixture was brought to ambient temperature and agitated for 14 h. 500 mL of 10% hydrochloric acid was slowly added to the reaction mixture at 15-20° C. (pH<1). The reaction mixture was extracted with CH$_2$Cl$_2$ (3×100 mL), the combined organic layers were washed twice with 10% HCl, dried over MgSO$_4$ and then the solvent was removed under vacuum. The residue was distilled under reduced pressure to give 32 g (60%) of fraction b.p. 46-48° C./0.05 mm Hg of TCN—(F)2(F, C(CF3)2OH). According to NMR data, the product was a mixture of two isomers in the ratio of 65:35. $^{19}$F NMR (CDCl$_3$,) major: −73.38(3F, m), −73.90(3F, m), −102.82(1F, dm; 217 Hz); −120.87(1F, dqd; 217; 16.4; 6.6 Hz)), −160.58 (1F, m); minor: −71.70 (3F, m), −72.56(3F, m), −106.03 (1F, dm; 225.5 Hz), −117.53(1F, dd; 225.5; 9.8Hz). Found: C, 41.43; H, 2.70.

Example 13

Preparation of TCN—(F, C(CF3)2OH)

a). Preparation of 2-fluoroacroyl fluoride (CH$_2$=CFC(O)F):

Into a 3 L flask equipped with a mechanical stirrer, dry-ice condenser and thermocouple was placed dry DMF (1.3 L), hydroquinone (6 g), and zinc (130 g). Sodium iodide (160 g) was added to the flask under N$_2$ flow with stirring in one portion. The reaction mixture was stirred at RT for 15 min. (The internal temperature was increased to 29° C.) Tetrafluorooxetane (130 g) was added dropwise to the reaction mixture, starting at a temperature of 35° C. The addition was complete in 1 hour. The internal temperature was kept between 36 and 42° C. most of time, but increased to 47° C. at the end of reaction for about 5 min. The mixture was stirred at 35-25° C. for 3 hours after the addition. The product was distilled at reduced pressure (~5 mm Hg) and collected in a dry-ice trap and a liquid N$_2$ trap in series. A total of 79.5 9 of liquid was obtained, which contained about 65% of product, 30% DMF and 5% impurities, based on NMR analysis. Calculated yield: 52%.

b) Preparation of cycloadduct of quadricyclane and CH$_2$=CFC(O)F:

A 400 mL shaker tube was charged with cold solution of 79 g of CH$_2$=CFC(O)F, (which contained 30% of DMF and 0.6 g of hydroquinone) in 100 mL of dry ether, and then 65 g of cold quadricyclane (90% purity, 10% of norbornadiene and MeOBu-t) was added. The reactor was kept at 110° C. for 16 h. The solvent and volatiles were removed from crude product under vacuum to give 111 g of crude cycloadduct, C, of 70% purity. The rest was DMF (~15%) and others (15%). There are two isomers: $^{19}$F NMR −26.3 (d, J=26 Hz, 1F), −150.7 (quintet, J=26 Hz, 1F); other isomer −20.2 (d, J=20 Hz, 1F), −171.2 (qq, J=19, 7 Hz, 1F) ppm. The crude product was used for the next step of the reaction (c) without further purification.

C c) Preparation of TCN—(F, C(CF3)2OH):

A 500 mL flask, equipped with dry-ice condenser, thermocouple, addition funnel and magnetic stirrer, was charged with dried CsF (15 g, 0.1 mol) and CH$_3$CN (150 mL) in a dry box. The solution of 111 g of crude cycloadduct C (about 0.42 mol from the step b) in CH$_3$CN (50 mL) was added over a 5 min period. The reaction mixture was stirred at ambient temperature for 15 min, then cooled down to 5° C. 120 g (0.85 mol) of trifluoromethyltrimethylsilane (Synquest) was added slowly over 1 h and 40 min. The resulting mixture was warmed up to 25° C. over 2 h and agitated at 25° C. for 16 h. The liquid of the reaction mixture was decanted, and the solid was washed with 50 mL of dry CH$_3$CN. The combined organic fractions were added to 500 mL of 5% hydrochloric acid. The resulting mixture was stirred at RT for 45 min. The mixture was extracted with CH$_2$Cl$_2$ (3×200 mL). The combined extracts were washed with HCl (5%, 4×150 mL), and dried over MgSO$_4$. The solvent was removed on a rotavapor to leave 155 g of crude product, which was distilled under vacuum to give fraction 1, 5 g (bp <42° C./0.05 mmHg) and fraction 2, 101.7 g, bp 51-63° C./0.05 mmHg (mainly 61-62° C./0.05 mmHg. Both fraction 1 and fraction 2 contained the trimethylsilyl ether of TCN—(F, C(CF3)2OH). They were treated with Bu$_4$NF (80 g) in THF (200 mL) at RT overnight. HCl (5%, 300 mL) was added and the organic layer was isolated. The aqueous layer was extracted with ether (2×200 mL). The ether extracts were combined with the organic layer and washed with water (3×100 mL), dried over Na$_2$SO$_4$, and concentrated to give a liquid. Reduced pressure distillation of the liquid gave TCN—(F, C(CF3)2OH), 77 g, bp 50-55° C./0.05 mmHg. Overall yield (from oxetane to the alcohol) was 25%. The product was a mixture of the two isomers in a 1:1 ratio. $^{19}$F NMR −72.5 (dm, J=147 Hz, 6F), −171.8 (m, 1F); other isomer −73.8 (dm, J=363 Hz, 1F), −145.6 (m, 1F) ppm.

Example 14

Synthesis of a TFE and TCN—(F)2(CF3, OH) Polymer

A 200 mL stainless steel pressure vessel was charged with 28.8 g TCN—(F)2(CF3, OH), 40 mL of Solkane® 365 mfc and 1.02 g of Perkadox® 16N initiator. The vessel was closed, cooled in dry ice, purged with nitrogen, evacuated, and charged with 20 g of TFE. The vessel was then agitated with its contents at 50° C. for 18 hr while the internal pressure decreased from 220 to 199 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours and then dried overnight in a vacuum oven with slight nitrogen purge at 88-90° C. There was isolated 9.97 g of white polymer; GPC analysis: M$_n$ 5300, M$_w$ 9300. T$_g$ 222° C. (DSC). $^{19}$F NMR (δ, THF-d8) −73.5 and −79.5 (CF$_3$), −95 to −125 (CF$_2$).

Example 15

Synthesis of a TFE and TCN—(CF3, C(CF3)2OH) Polymer

A 200 mL stainless steel pressure vessel was charged with 42.5 g TCN—(CF3, C(CF3)2OH), 50 mL of Solkane® 365 mfc and 1.08 g of Perkadox® 16N initiator. The vessel was closed, cooled in dry ice, purged with nitrogen, evacuated, and charged with 22 g of TFE. The vessel was then agitated with its contents at 50° C. for 18 hr while the internal pressure decreased from 219 to 211 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours, and then dried overnight in a vacuum oven with slight nitrogen purge at 88-90° C. There was isolated 9.7 g of white polymer. GPC analysis: M$_n$ 4200, M$_w$ 6200. T$_g$ 209° C. (DSC). $^{19}$F NMR (δ, THF-d8) −60.9 and −67.8 (CF$_3$), −75.5 (C(CF$_3$)$_2$OH), −95 to −125 (CF$_2$). Anal. Found: C, 41.87: H, 2.95; F, 49.76.

Example 16

Synthesis of a TFE and TCN—(F)2(F, C(CF3)2OH) Polymer

A 200 mL stainless steel pressure vessel was charged with 37.4 g TCN—(F)2(F, C(CF3)2OH, 50 mL of Solkane® 365 mfc and 1.0 g of Perkadox® 16N initiator. The vessel was closed, cooled in dry ice, purged with nitrogen, evacuated, and charged with 20 g of TFE. The vessel was then agitated with its contents at 50° C. for 18 hr while the internal pressure decreased from 208 to 181 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours and then dried overnight in a vacuum oven with slight nitrogen purge at 88-90° C. There was isolated 17.8 g of white polymer. GPC analysis: M$_n$ 4800, M$_w$ 7400. T$_g$ 228° C. (DSC). $^{19}$F NMR (δ, THF-d8) −156 to −160 and −185 (CF), −70.6 and −72.5 (C(CF$_3$)$_2$OH), −95 to −125 (CF$_2$). Anal. Found: C, 39.57: H, 2.47; F, 53.05.

Example 17

Synthesis of a TFE and TCN—(F), C(CF3)2OH) Polymer

A 200 mL stainless steel pressure vessel was charged with 60.8 g TCN—(F), C(CF3)2OH), 50 mL of Solkane® 365 mfc and 1.59 g of Perkadox® 16N initiator. The vessel was closed, cooled in dry ice, purged with nitrogen, evacuated, and charged with 30 g of TFE. The vessel was then agitated with its contents at 50° C. for 18 hr while the internal pressure decreased from 257 to 240 psi. The vessel was cooled to room temperature and vented to 1 atmosphere. The vessel contents were removed using additional Solkane® 365 mfc to rinse. The combined reactor solution and rinse were added to excess hexane (30-35 mL portions to 650 mL of hexane). The precipitates were filtered, washed with hexane, air dried for several hours, and then dried overnight in a vacuum oven with slight nitrogen purge at 88-90° C. There was isolated 16.5 g of white polymer. GPC analysis: $M_n$ 4700, $M_w$ 9300. $T_g$ 205° C. (DSC). $^{19}$F NMR (δ, THF-d8) −167.8, −168.9, −140.7 and −143.8 (ring CF), −71 to −76 (C(CF$_3$)$_2$OH), −95 to −125 (CF$_2$). Anal. Found: C, 44.647: H, 3.13: F, 44.82.

What is claimed is:

1. A polymer comprising a repeat unit derived from
   (a) at least one repeat unit derived from an ethylenically unsaturated compound having at least one fluorine atom covalently attached to an ethylenically unsaturated carbon atom; and
   (b) at least one repeat unit derived from an ethylenically unsaturated compound having the structure:

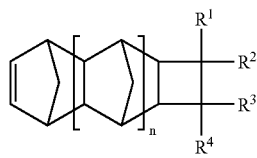

(I)

wherein n is 0, 1, or 2;

$R^1$, $R^2$, $R^3$ and $R^4$ are independently H, $OR^5$, halogen, alkyl or alkoxy of 1 to 10 carbon atoms, optionally substituted by halogen or ether oxygens, Y, $C(R_f)(R_f')OR^5$, $R^6Y$ or $OR^6Y$;

Y is COZ or SO$_2$Z;

$R^5$ is hydrogen or an acid-labile protecting group;

$R_f$ and $R_f'$ are the same or different fluoroalkyl groups of 1 to 10 carbon atoms or taken together are $(CF_2)_m$ where m is 2 to 10;

$R^6$ is an alkylene group of 1 to 20 carbon atoms, optionally substituted by halogen or ether oxygen;

Z is OH, halogen, or $OR^7$; and $R^7$ is an alkyl group of 1 to 20 carbon atoms, with the proviso that at least one of $R^1$, $R^2$, $R^3$ and $R^4$ is Y, $OR^5$, $C(R_f)(R_f')OR^5$, $R^6Y$ or $OR^6Y$, and the proviso that if $R^1$ (or $R^3$) is OH, $R^2$ (or $R^4$) is not OH or halogen.

2. The polymer of claim 1, wherein the compound having structure (I) is selected from the group consisting of:

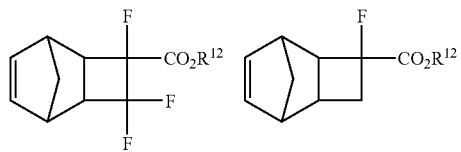

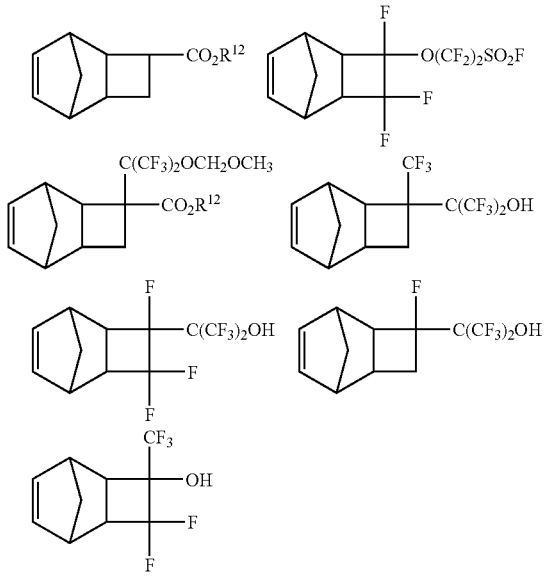

wherein $R^{12}$ is an alkyl group of 1 to 20 carbon atoms.

3. The polymer of claim 1, wherein the at least one ethylenically unsaturated compound having at least one fluorine atom covalently attached to an ethylenically unsaturated carbon atom is a fluoroolefin which comprises 2 to 20 carbon atoms.

4. The polymer of claim 3, wherein the fluoroolefin is selected from the group consisting of tetrafluoroethylene; hexafluoropropylene; chlorotrifluoroethylene; vinylidene fluoride; vinyl fluoride; perfluoro-(2,2-dimethyl-1,3-dioxole); perfluoro-(2-methylene-4-methyl-1,3-dioxolane); $CF_2=CFO(CF_2)_tCF=CF_2$, wherein t is 1 or 2; and $R_f''OCF=CF_2$ wherein $R_f''$ is a saturated fluoroalkyl group of from 1 to 10 carbon atoms.

5. The polymer of claim 4, wherein the fluoroolefin is tetrafluoroethylene.

6. The polymer of claim 1, further comprising a unit containing a fluoroalcohol group or a protected fluoroalcohol group.

7. The polymer of claim 6, wherein the fluoroalcohol group or the protected fluoroalcohol group is derived from at least one ethylenically unsaturated compound containing a fluoroalcohol group having the structure:

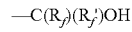

wherein $R_f$ and $R_f'$ are the same or different fluoroalkyl groups of from 1 to 10 carbon atoms or taken together are $(CF_2)_m$ wherein m is 2 to 10.

8. The polymer of claim 7, wherein $R_f$ and $R_f'$ are perfluoroalkyl groups.

9. The polymer of claim 1, further comprising a unit containing a fluoroalcohol group having the structure:

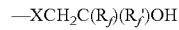

wherein $R_f$ and $R_f'$ are the same or different fluoroalkyl groups of from 1 to 10 carbon atoms or taken together are $(CF_2)_m$ wherein m is 2 to 10; and X is an element from Group VA or Group VIA of the Periodic Table of the Elements.

10. The polymer of claim 9, wherein X is selected from the group consisting of oxygen, sulfur, nitrogen and phosphorous.

11. The polymer of claim 10, wherein X is oxygen.

12. The polymer of claim 7, wherein fluoroalcohol group or the protected fluoroalcohol group is derived from a monomer selected from the group consisting of:

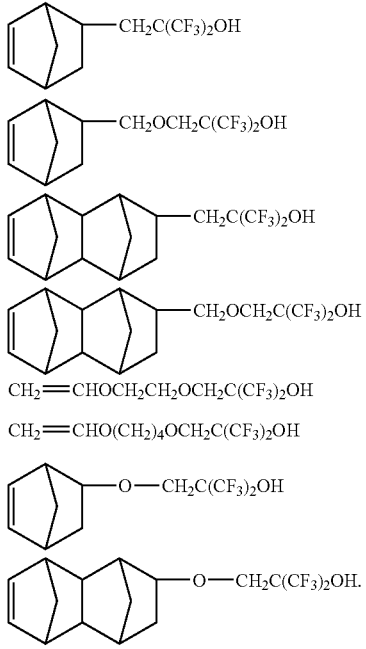

13. The polymer of claim 1 further comprising at least one acid-containing or protected acid-containing group of structural unit:

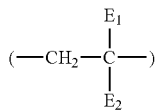

wherein $E_1$ is H or $C_1$-$C_{12}$ alkyl; $E_2$ is $CO_2E_3$, $SO_3E$, or other acidic group; and E and $E_3$ are independently selected from the group of H, unsubstituted $C_1$-$C_{12}$ alkyl, and heteroatom substituted $C_1$-$C_{12}$ alkyl.

14. The polymer of claim 13, wherein the heteroatom is selected from the group consisting of oxygen, nitrogen, sulfur, halogen and phosphorus atoms.

15. The polymer of claim 14, wherein the heteroatom is oxygen, and the heteroatom substituted $C_1$-$C_{12}$ alkyl further comprises a hydroxyl group.

16. The polymer of claim 13, wherein the acid-containing or protected acid-containing group is derived from a carboxylic acid-containing monomer.

17. The polymer of claim 13, wherein the acid-containing or protected acid-containing group is derived from a monomer selected from the group consisting of tert-butyl acrylate; 2-methyl-2-adamantyl acrylate; 2-methyl-2-norbornyl acrylate and acrylic acid.

18. The polymer of claim 1, further comprising at least one group derived from a polar monomer.

19. A photoresist composition comprising:
(1) a fluorine-containing polymer, wherein the fluorine-containing polymer comprises:
(a) at least one repeat unit derived from an ethylenically unsaturated compound having at least one fluorine atom covalently attached to an ethylenically unsaturated carbon atom; and
(b) at least one repeat unit derived from an ethylenically unsaturated compound having the structure:

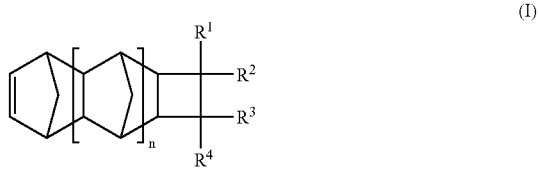

wherein n is 0, 1, or 2;
$R^1$, $R^2$, $R^3$ and $R^4$ are independently H, $OR^5$, halogen, alkyl or alkoxy of 1 to 10 carbon atoms, optionally substituted by halogen or ether oxygens, Y, $C(R_f)(R_f')OR^5$, $R^6Y$ or $OR^6Y$;
Y is COZ or $SO_2Z$;
$R^5$ is hydrogen or an acid-labile protecting group;
$R_f$ and $R_f'$ are the same or different fluoroalkyl groups of 1 to 10 carbon atoms or taken together are $(CF_2)_m$ where m is 2 to 10;
$R^6$ is an alkylene group of 1 to 20 carbon atoms, optionally substituted by halogen or ether oxygen;
Z is OH, halogen, or $OR^7$; and
$R^7$ is an alkyl group of 1 to 20 carbon atoms, with the proviso that at least one of $R^1$, $R^2$, $R^3$ and $R^4$ is $OR^5$, Y, $C(R_f)(R_f')OR^5$, $R^6Y$ or $OR^6Y$, and the proviso that if $R^1$ (or $R^3$) is OH, $R^2$ (or $R^4$) is not OH or halogen; and
(2) a photoactive component.

20. The photoresist composition of claim 19, wherein the monomer having structure (I) in the fluorine-containing polymer is selected from the group consisting of:

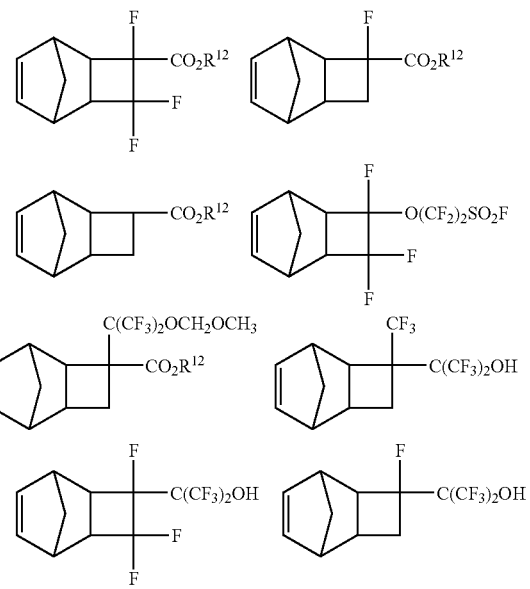

-continued

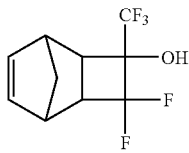

wherein R$^{12}$ is an alkyl group of 1 to 20 carbon atoms.

21. The photoresist composition of claim 19, wherein (a) is a fluoroolefin comprising 2 to 20 carbon atoms.

22. The photoresist composition of claim 21, wherein the fluoroolefin is selected from the group consisting of tetrafluoroethylene; hexafluoropropylene; chlorotrifluoroethylene; vinylidene fluoride; vinyl fluoride; perfluoro-(2,2-dimethyl-1,3-dioxole); perfluoro-(2-methylene-4-methyl-1,3-dioxolane); CF$_2$=CFO(CF$_2$)$_t$CF=CF$_2$, wherein t is 1 or 2; and R$_f''$OCF=CF$_2$, wherein R$_f''$ is a saturated fluoroalkyl group of from 1 to 10 carbon atoms.

23. The photoresist composition of claim 22, wherein the fluoroolefin is tetrafluoroethylene.

24. The photoresist composition of claim 19, wherein the fluorine-containing polymer further comprises a unit containing a fluoroalcohol group or a protected fluoroalcohol group.

25. The photoresist composition of claim 24, wherein the fluoroalcohol group or the protected fluoroalcohol group is derived from at least one ethylenically unsaturated compound containing a fluoroalcohol group having the structure:

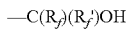
—C(R$_f$)(R$_f'$)OH wherein R$_f$ and R$_f'$ are the same or different fluoroalkyl groups of from 1 to 10 carbon atoms or taken together are (CF$_2$)$_m$ wherein m is 2 to 10.

26. The photoresist composition of claim 25, wherein R$_f$ and R$_f'$ are perfluoroalkyl groups.

27. The photoresist composition of claim 19, wherein the fluorine-containing polymer further comprises a fluoroalcohol group having the structure:

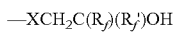
—XCH$_2$C(R$_f$)(R$_f'$)OH wherein R$_f$ and R$_f'$ are the same or different fluoroalkyl groups of from 1 to 10 carbon atoms or taken together are (CF$_2$)$_m$ wherein m is 2 to 10; and X is an element from Group VA and VIA of the Periodic Table of the Elements.

28. The photoresist composition of claim 27, wherein X is selected from the group consisting of oxygen, sulfur, nitrogen and phosphorous.

29. The photoresist composition of claim 28, wherein X is oxygen.

30. The photoresist composition of claim 25, wherein the monomer containing the fluoroalcohol functional group or the protected fluoroalcohol group is selected from the group consisting of:

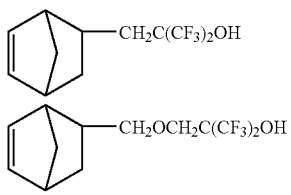

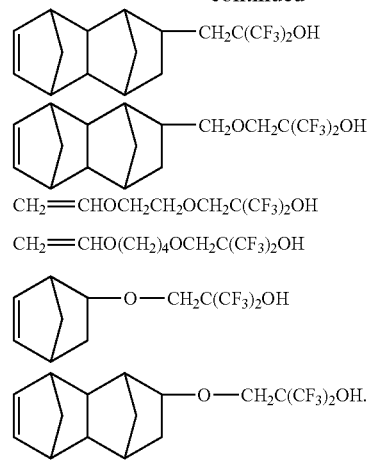

31. The photoresist composition of claim 19, wherein the fluorine-containing polymer further comprises at least one acid-containing or protected acid-containing group of structural unit:

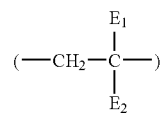

wherein E$_1$ is H or C$_1$-C$_{12}$ alkyl; E$_2$ is CO$_2$E$_3$, SO$_3$E, or other acidic group; and E and E$_3$ are independently selected from the group of H, unsubstituted C$_1$-C$_{12}$ alkyl, and heteroatom substituted C$_1$-C$_{12}$ alkyl.

32. The photoresist composition of claim 31, wherein the heteroatom is selected from the group consisting of oxygen, nitrogen, sulfur, halogen and phosphorus atoms.

33. The photoresist composition of claim 32, wherein the heteroatom is oxygen, and the heteroatom substituted C$_1$-C$_{12}$ alkyl further comprises a hydroxyl group.

34. The photoresist composition of claim 31, wherein the acid-containing or protected acid-containing group is a carboxylic acid-containing monomer.

35. The photoresist composition of claim 34, wherein the acid-containing or protected acid-containing group is selected from the group consisting of tert-butyl acrylate; 2-methyl-2-adamantyl acrylate; 2-methyl-2-norbornyl acrylate and acrylic acid.

36. The photoresist composition of claim 19, wherein the fluorine-containing polymer further comprises at least one group derived from a polar monomer.

37. The photoresist composition of claim 19, wherein the photoactive component is a photoacid generator.

38. The photoresist composition of claim 19, further comprising a dissolution inhibitor.

39. The photoresist composition of claim 19, further comprising a solvent.

40. The photoresist composition of claim 39, wherein the solvent is selected from the group consisting of an ether ester; a ketone; an ester; a glycol ether; a substituted hydrocarbon; an aromatic hydrocarbon; a fluorinated solvent and super critical CO$_2$.

41. The photoresist composition of claim 19, further comprising at least one additive selected from the group consisting of bases, surfactants, resolution enhancers, adhesion promoters, residue reducers, coating aids, plasticizers, and T$_g$ (glass transition temperature) modifiers.

42. A coated substrate comprising:
(1) a substrate; and
(2) a photoresist composition comprising:
   (a) a fluorine-containing polymer comprising a repeat unit derived from:
      (i) at least one repeat unit derived from an ethylenically unsaturated compound having at least one fluorine atom covalently attached to an ethylenically unsaturated carbon atom; and
      (ii) at least one repeat unit derived from an ethylenically unsaturated compound having the structure:

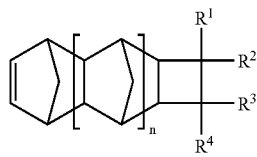

(I)

wherein n is 0, 1, or 2;

R$^1$, R$^2$, R$^3$ and R$^4$ are independently H, OR$^5$, halogen, alkyl or alkoxy of 1 to 10 carbon atoms, optionally substituted by halogen or ether oxygens, Y, C(R$_f$)(R$_f'$)OR$^5$, R$^6$Y or OR$^6$Y;

Y is COZ or SO$_2$Z;

R$^5$ is hydrogen or an acid-labile protecting group;

R$_f$ and R$_f'$ are the same or different fluoroalkyl groups of 1 to 10 carbon atoms or taken together are (CF$_2$)$_m$ where m is 2 to 10;

R$^6$ is an alkylene group of 1 to 20 carbon atoms, optionally substituted by halogen or ether oxygen;

Z is OH, halogen, or OR$^7$; and

R$^7$ is an alkyl group of 1 to 20 carbon atoms, with the proviso that at least one of R$^1$, R$^2$, R$^3$ and R$^4$ is Y, OR$^5$, C(R$_f$)(R$_f'$)OR$^5$, R$^6$Y or OR$^6$Y, and the proviso that if R$^1$ (or R$^3$) is OH, R$^2$ (or R$^4$) is not OH or halogen; and
   (b) a photoactive component.

43. The coated substrate of claim 42, wherein the substrate is a microelectronic wafer.

44. The coated substrate of claim 43, wherein the microelectronic wafer comprises a material selected from the group consisting of silicon, silicon oxide, silicon oxynitride, and silicon nitride.

45. A reaction product of quadricyclane and a fluoroalkylbenzoate compound.

* * * * *